United States Patent
Yoshikawa et al.

(10) Patent No.: US 11,609,035 B2
(45) Date of Patent: Mar. 21, 2023

(54) REFRIGERANT CIRCULATING APPARATUS AND METHOD OF CIRCULATING REFRIGERANT

(71) Applicant: NEC Corporation, Tokyo (JP)

(72) Inventors: Minoru Yoshikawa, Tokyo (JP); Hisato Sakuma, Tokyo (JP); Masaki Chiba, Tokyo (JP)

(73) Assignee: NEC CORPORATION, Tokyo (JP)

( * ) Notice: Subject to any disclaimer, the term of this patent is extended or adjusted under 35 U.S.C. 154(b) by 169 days.

(21) Appl. No.: 16/060,994

(22) PCT Filed: Dec. 16, 2016

(86) PCT No.: PCT/JP2016/087605
§ 371 (c)(1),
(2) Date: Jun. 11, 2018

(87) PCT Pub. No.: WO2017/110683
PCT Pub. Date: Jun. 29, 2017

(65) Prior Publication Data
US 2018/0363968 A1   Dec. 20, 2018

(30) Foreign Application Priority Data

Dec. 21, 2015 (JP) .............................. JP2015-248300
May 19, 2016 (JP) .............................. JP2016-100449

(51) Int. Cl.
*F25D 9/00* (2006.01)
*G06F 1/20* (2006.01)
(Continued)

(52) U.S. Cl.
CPC .............. *F25D 9/00* (2013.01); *F25B 23/006* (2013.01); *F28D 15/0275* (2013.01);
(Continued)

(58) Field of Classification Search
CPC ................ F25B 43/006; F25B 2400/23; F25B 2700/2109; F25B 23/006; H01L 23/467;
(Continued)

(56) References Cited

U.S. PATENT DOCUMENTS 5,406,807 A * 4/1995 Ashiwake ............. H01L 23/427
361/699
6,449,969 B1 * 9/2002 Fujimoto .............. F25B 25/005
62/180
(Continued)

FOREIGN PATENT DOCUMENTS

CN   101814469 A  *  8/2010
JP   S48-018843 A    3/1973
(Continued)

OTHER PUBLICATIONS

International Search Report for PCT Application No. PCT/JP2016/087605, dated Mar. 14, 2017.
(Continued)

*Primary Examiner* — Miguel A Diaz

(57) ABSTRACT

In a phase-change cooling apparatus including an indoor unit and an outdoor unit, a configuration to prevent dew condensation in the indoor unit causes the cooling performance to decrease; therefore, a refrigerant circulating apparatus according to an exemplary aspect of the present invention includes refrigerant-liquid thermal equilibrium means for mixing a first refrigerant liquid with a second refrigerant liquid and sending a reflux refrigerant liquid composed of the first refrigerant liquid and the second refrigerant liquid, the first refrigerant liquid being a liquid-phase refrigerant included in a gas-liquid two-phase refrigerant flowing in from heat receiving means, the second refrigerant liquid arising due to the gas-liquid two-phase refrigerant cooled by heat radiating means; a refrigerant passage configured for the gas-liquid two-phase refrigerant
(Continued)

and the reflux refrigerant liquid to circulate between the heat receiving means and the refrigerant-liquid thermal equilibrium means; refrigerant-liquid reflux means for refluxing the reflux refrigerant liquid to the heat receiving means through the refrigerant passage; and refrigerant-liquid flow control means for controlling a flow rate of the reflux refrigerant liquid.

7 Claims, 14 Drawing Sheets

(51) Int. Cl.
    *F25B 23/00*     (2006.01)
    *H05K 7/20*     (2006.01)
    *F28D 15/06*     (2006.01)
    *F28D 15/02*     (2006.01)
    *H01L 23/467*     (2006.01)

(52) U.S. Cl.
    CPC ............ *F28D 15/06* (2013.01); *G06F 1/20* (2013.01); *H05K 7/2079* (2013.01); *G06F 2200/201* (2013.01); *H01L 23/467* (2013.01); *H05K 7/209* (2013.01)

(58) Field of Classification Search
    CPC ............ H05K 7/2029; H05K 7/20381; H05K 7/20318; H05K 7/20327; H05K 7/209; H05K 7/2079; F28D 2021/0028; F28D 15/0275; F28D 15/06; F25D 9/00; G06F 1/20; G06F 2200/201
    See application file for complete search history.

(56) References Cited

U.S. PATENT DOCUMENTS

| | | | |
|---|---|---|---|
| 6,925,829 B2* | 8/2005 | Wei | F28D 1/0477 165/104.33 |
| 8,028,539 B2* | 10/2011 | Yoon | F25B 31/004 62/503 |
| 8,931,303 B2* | 1/2015 | Toyoshima | F25B 31/004 62/471 |
| 9,719,699 B2* | 8/2017 | Tamura | F25B 1/10 |
| 10,465,957 B2* | 11/2019 | Yokoyama | F25B 43/02 |
| 2007/0038333 A1* | 2/2007 | Dadebo | G05B 13/042 700/270 |
| 2009/0201644 A1* | 8/2009 | Kelley | H05K 7/20781 361/699 |
| 2010/0307716 A1* | 12/2010 | Bean, Jr. | H05K 7/20827 165/80.2 |
| 2011/0259573 A1 | 10/2011 | Ezawa et al. | |
| 2011/0271695 A1* | 11/2011 | Kashirajima | H05K 7/20809 62/62 |
| 2012/0324933 A1* | 12/2012 | Louvar | H05K 7/20327 62/196.4 |

FOREIGN PATENT DOCUMENTS

| | | |
|---|---|---|
| JP | H04-76335 A | 3/1992 |
| JP | 2005-140464 A | 6/2005 |
| JP | 2011-247573 A | 12/2011 |

OTHER PUBLICATIONS

English translation of Written opinion for PCT Application No. PCT/JP2016/087605.

\* cited by examiner

REFRIGERANT CIRCULATING APPARATUS AND METHOD OF CIRCULATING REFRIGERANT

This application is a National Stage Entry of PCT/JP2016/087605 filed on Dec. 16, 2016, which claims priority from Japanese Patent Application 2015-248300 filed on Dec. 21, 2015 and 2016-100449 filed on May 19, 2016, the contents of all of which are incorporated herein by reference, in their entirety.

TECHNICAL FIELD

The present invention relates to refrigerant circulating apparatuses and methods of circulating refrigerants and, in particular, to a refrigerant circulating apparatus and a method of circulating a refrigerant that are used in a cooling apparatus in which heat is transported and radiated by a cycle of vaporization and condensation of a refrigerant.

BACKGROUND ART

In recent years, the role of a data center, where servers and network equipment to conduct information processing are gathered at a single site, has been increasingly significant due to the expansion of Internet services and the like. The amount of power consumption in the data center has been increasing with an increase in the throughput. Thus, there is an attempt to reduce the power of an air-conditioning machine in the data center and the like by using a cooling apparatus with phase-change cooling methods (phase-change cooling apparatus) in combination with the air-conditioning machine. Here, the phase-change cooling apparatus is defined as a cooling apparatus in which heat is transported by using latent heat that arises at the time when the phase of the refrigerant changes from the liquid phase to the vapor phase or from the vapor phase to the liquid phase.

The phase-change cooling apparatus transports indoor heat received in an indoor unit to an outside radiator (outdoor unit) with a vapor-phase refrigerant. The refrigerant having exhausted heat in the outdoor unit turns to a liquid-phase refrigerant and flows back to the inside with the temperature of the liquid refrigerant being supercooled to the outside air temperature. This causes the problem that condensation occurs on the surface of the indoor unit when outside air temperatures are cool like in winter.

Patent Literature 1 discloses a technology to solve such a problem. As illustrated in FIG. 14, a related cooling system 500 described in Patent Literature 1 includes an indoor heat exchange unit 510 installed inside a room IN, an outdoor heat exchange unit 520 installed outside the room OUT, and an internal heat exchanger 530.

The related cooling system 500 further includes a piping system 540 that enables a refrigerant to circulate naturally between the indoor heat exchange unit 510 and the outdoor heat exchange unit 520. The piping system includes a first supply pipe 541 and a second supply pipe 542. The first supply pipe 541 supplies a liquid refrigerant heated by heat exchanging with a vaporized refrigerant supplied from the indoor heat exchange unit 510 to the outdoor heat exchange unit 520 by the internal heat exchanger 530, from the outdoor heat exchange unit 520 to the indoor heat exchange unit 510. The second supply pipe 542 supplies the liquid refrigerant from the outdoor heat exchange unit 520 to the indoor heat exchange unit 510 bypassing the internal heat exchanger 530.

The related cooling system 500, using the first supply pipe 541, can supply a liquid refrigerant heated by heat exchanging with a vaporized refrigerant by the internal heat exchanger 530 to the indoor heat exchange unit 510. Consequently, it is said that condensation in the indoor heat exchange unit 510 can be suppressed by heating the liquid refrigerant by the internal heat exchanger 530 even though the temperature of the liquid refrigerant supplied from the outdoor heat exchange unit 520 is lower than or equal to a temperature at which condensation occurs in the indoor heat exchange unit 510.

CITATION LIST

Patent Literature

[PTL 1] Japanese Unexamined Patent Application Publication No. 2011-247573

SUMMARY OF INVENTION

Technical Problem

As mentioned above, the related cooling system 500 is configured to exchange heat between a vapor-phase refrigerant and a liquid-phase refrigerant (refrigerant liquid) by the internal heat exchanger 530, by which the refrigerant liquid is heated until its temperature becomes greater than or equal to a dew-point temperature. However, the vapor-phase refrigerant is condensed and liquefied due to the heat exchange. If there is condensed liquefied refrigerant liquid in a vapor-phase pipe, a pressure loss in the vapor-phase pipe increases, which cause heat transport performance to decrease. As a result, the related cooling system 500 has the problem that the cooling performance decreases.

As described above, there has been the problem that, in a phase-change cooling apparatus including an indoor unit and an outdoor unit, a configuration to prevent dew condensation in the indoor unit causes the cooling performance to decrease.

The object of the present invention is to provide a refrigerant circulating apparatus and a method of circulating a refrigerant that solve the above-mentioned problem that, in a phase-change cooling apparatus including an indoor unit and an outdoor unit, a configuration to prevent dew condensation in the indoor unit causes the cooling performance to decrease.

Solution to Problem

A refrigerant circulating apparatus according to an exemplary aspect of the present invention includes refrigerant-liquid thermal equilibrium means for mixing a first refrigerant liquid with a second refrigerant liquid and sending a reflux refrigerant liquid composed of the first refrigerant liquid and the second refrigerant liquid, the first refrigerant liquid being a liquid-phase refrigerant included in a gas-liquid two-phase refrigerant flowing in from heat receiving means, the second refrigerant liquid arising due to the gas-liquid two-phase refrigerant cooled by heat radiating means; a refrigerant passage configured for the gas-liquid two-phase refrigerant and the reflux refrigerant liquid to circulate between the heat receiving means and the refrigerant-liquid thermal equilibrium means; refrigerant-liquid reflux means for refluxing the reflux refrigerant liquid to the heat receiving means through the refrigerant passage; and refrigerant-liquid flow control means for controlling a flow rate of the reflux refrigerant liquid.

A method of circulating a refrigerant according to an exemplary aspect of the present invention includes making a first refrigerant liquid and a second refrigerant liquid be in thermal equilibrium with each other, the first refrigerant liquid being a liquid-phase refrigerant included in a gas-liquid two-phase refrigerant arising on a heat receiving side, the second refrigerant liquid arising due to the gas-liquid two-phase refrigerant cooled on a heat radiating side; generating a reflux refrigerant liquid composed of the first refrigerant liquid and the second refrigerant liquid in thermal equilibrium; refluxing the reflux refrigerant liquid to the heat receiving side; and controlling a flow rate of the reflux refrigerant liquid.

Advantageous Effects of Invention

According to the refrigerant circulating apparatus and the method of circulating a refrigerant of the present invention, dew condensation in an indoor unit can be prevented without decreasing the cooling performance of a phase-change cooling apparatus including the indoor unit and an outdoor unit.

EXAMPLE EMBODIMENT

Example embodiments of the present invention will be described below with reference to drawings.

First Example Embodiment

Figure 1:
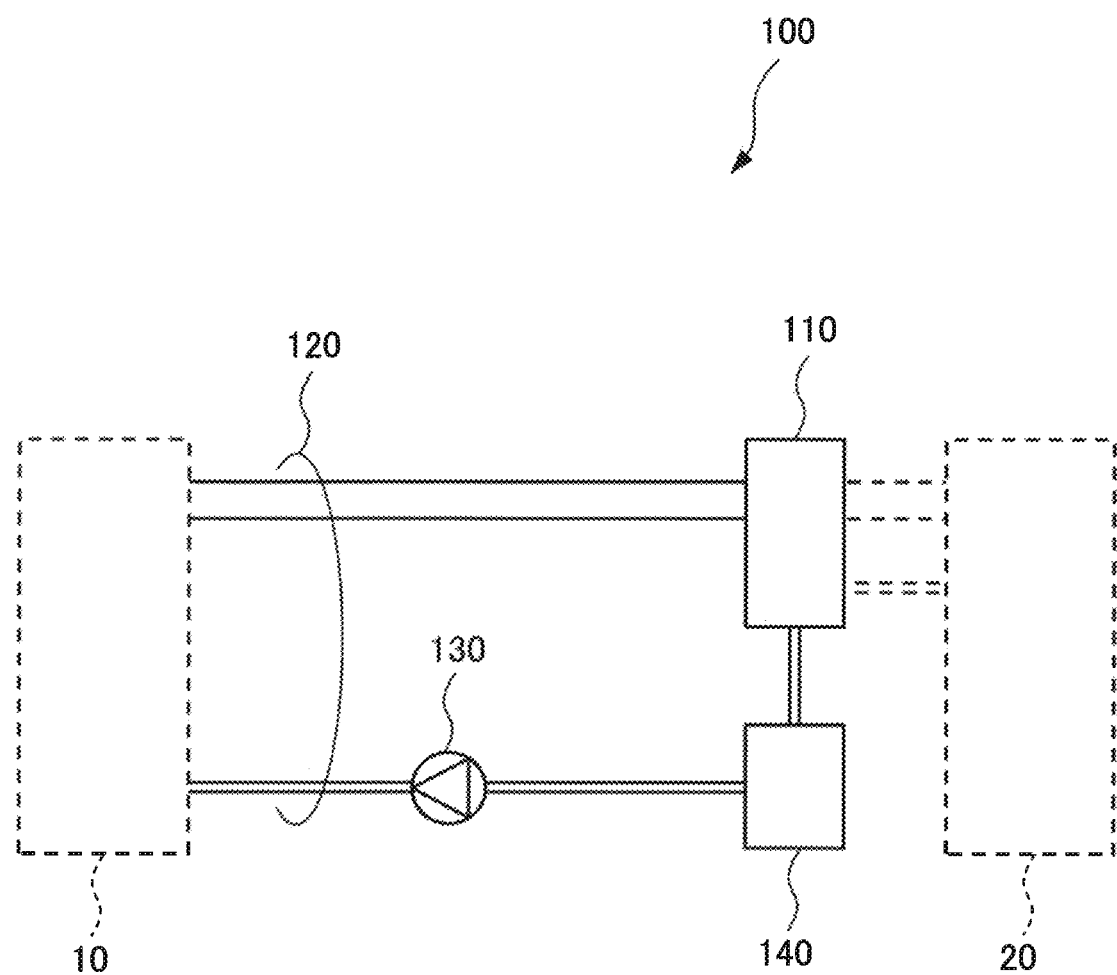
FIG. 1 is a schematic diagram illustrating a configuration of a refrigerant circulating apparatus according to a first example embodiment of the present invention.

FIG. 1 is a schematic diagram illustrating a configuration of a refrigerant circulating apparatus 100 according to a first example embodiment of the present invention. The refrigerant circulating apparatus 100 according to the present example embodiment includes a refrigerant-liquid thermal equilibrium means 110, a refrigerant passage 120, a refrigerant-liquid reflux means 130, and a refrigerant-liquid flow control means 140.

The refrigerant-liquid thermal equilibrium means 110 mixes an excess refrigerant liquid (first refrigerant liquid) with a supercooled refrigerant liquid (second refrigerant liquid), and equalizes temperatures. The excess refrigerant liquid is a liquid-phase refrigerant included in a gas-liquid two-phase refrigerant flowing in from a heat receiving means 10. The supercooled refrigerant liquid arises due to the gas-liquid two-phase refrigerant cooled by a heat radiating means 20. In other words, the excess refrigerant liquid and the supercooled refrigerant liquid are made to be in thermal equilibrium with each other. The refrigerant-liquid thermal equilibrium means 110 is configured to send a reflux refrigerant liquid composed of the excess refrigerant liquid and the supercooled refrigerant liquid that are in thermal equilibrium.

The refrigerant passage 120 is configured for the gas-liquid two-phase refrigerant and the reflux refrigerant liquid to circulate between the heat receiving means 10 and the refrigerant-liquid thermal equilibrium means 110. The refrigerant-liquid reflux means 130 refluxes the reflux refrigerant liquid to the heat receiving means 10 through the refrigerant passage 120. The refrigerant-liquid flow control means 140 controls a flow rate of the reflux refrigerant liquid.

As mentioned above, in the refrigerant circulating apparatus 100 according to the present example embodiment, the refrigerant-liquid thermal equilibrium means 110 is configured to send the reflux refrigerant liquid composed of the excess refrigerant liquid and the supercooled refrigerant liquid that are in thermal equilibrium. Here, the excess refrigerant liquid is a liquid-phase refrigerant included in the gas-liquid two-phase refrigerant, and the temperature of the excess refrigerant liquid has increased by sensible heat in the heat receiving means 10. The refrigerant-liquid flow late control means 140 is configured to control the flow rate of the reflux refrigerant liquid, which enables the temperature of the reflux refrigerant liquid to be controlled, because the flow rate of the excess refrigerant liquid depends on the flow rate of the reflux refrigerant liquid flowing into the heat receiving means 10.

As a result, it becomes possible to raise the temperature of the reflux refrigerant liquid flowing back to the heat receiving means 10 inside a room higher than a dew-point temperature inside a room, even though the condensed liquefied refrigerant liquid is further supercooled to the outside air temperature by the heat radiating means 20 installed outside the room and turns to a supercooled refrigerant liquid.

Further, according to the above-mentioned configuration, the excess refrigerant liquid turns to a reflux refrigerant liquid in the refrigerant-liquid thermal equilibrium means 110 and flows back to the heat receiving means 10; consequently, it is possible to prevent the excess refrigerant liquid from flowing out to the heat radiating means 20 side. Therefore, a decrease in heat transport performance due to the excess refrigerant liquid on the heat radiating means 20 side does not arise, which causes no decrease in cooling performance.

As described above, according to the refrigerant circulating apparatus 100 of the present example embodiment, dew condensation in an indoor unit can be prevented without decreasing the cooling performance of a phase-change cooling apparatus including the indoor unit and an outdoor unit.

Because the reflux refrigerant liquid is composed of the excess refrigerant liquid and the supercooled refrigerant liquid that are in thermal equilibrium, the flow rate of the reflux refrigerant liquid can also be controlled by controlling the flow rate of the excess refrigerant liquid that will be in thermal equilibrium with the supercooled refrigerant liquid.

The refrigerant-liquid thermal equilibrium means 110 can be configured to include a thermal equilibrium section to make the excess refrigerant liquid and the supercooled refrigerant liquid in thermal equilibrium, and a joining section to make the excess refrigerant liquid and the supercooled refrigerant liquid join. Specifically, the refrigerant-liquid thermal equilibrium means 110 can be configured to include a forked (bifurcated) piping or the like, for example. The refrigerant-liquid thermal equilibrium means 110 is not limited to this, and it may be configured to include a container section such as a tank that stores the excess refrigerant liquid and the supercooled refrigerant liquid.

The refrigerant passage 120 is typically a piping made of metal or resin. The refrigerant-liquid reflux means 130 is typically a pump. The refrigerant-liquid flow control means 140 is typically a variable flow rate valve.

Next, a method of circulating a refrigerant according to the present example embodiment will be described.

In the method of circulating a refrigerant in the present example embodiment, first, an excess refrigerant liquid and a supercooled refrigerant liquid are made to be in thermal equilibrium with each other. The excess refrigerant liquid is a liquid-phase refrigerant included in a gas-liquid two-phase refrigerant arising on a heat receiving side. The supercooled refrigerant liquid arises due to the gas-liquid two-phase refrigerant cooled on a heat radiating side. Then, a reflux refrigerant liquid composed of the excess refrigerant liquid and the supercooled refrigerant liquid that are in thermal equilibrium is generated, and the reflux refrigerant liquid is refluxed to the heat receiving side. At this time, a flow rate of the reflux refrigerant liquid is controlled.

Here, the excess refrigerant liquid is a liquid-phase refrigerant included in the gas-liquid two-phase refrigerant, and the temperature of the excess refrigerant liquid has increased by sensible heat on the heat receiving side. The configuration to control the flow rate of the reflux refrigerant liquid enables the temperature of the reflux refrigerant liquid to be controlled, because the flow rate of the excess refrigerant liquid depends on the flow rate of the reflux refrigerant liquid flowing into the heat receiving side. As a result, it becomes possible to raise the temperature of the reflux refrigerant liquid flowing back into a room higher than a dew-point temperature inside a room, even though the refrigerant liquid condensed and liquefied on the heat radiating side outside the room is further supercooled to the outside air temperature and turns to a supercooled refrigerant liquid.

Because the excess refrigerant liquid can be prevented from flowing into the heat radiating side, a decrease in cooling performance due to the excess refrigerant liquid on the heat radiating side does not arise.

As described above, according to the refrigerant circulating apparatus 100 and the method of circulating a refrigerant of the present example embodiment, dew condensation in an indoor unit can be prevented without decreasing the cooling performance of a phase-change cooling apparatus including the indoor unit and an outdoor unit.

Second Example Embodiment

Figure 2:
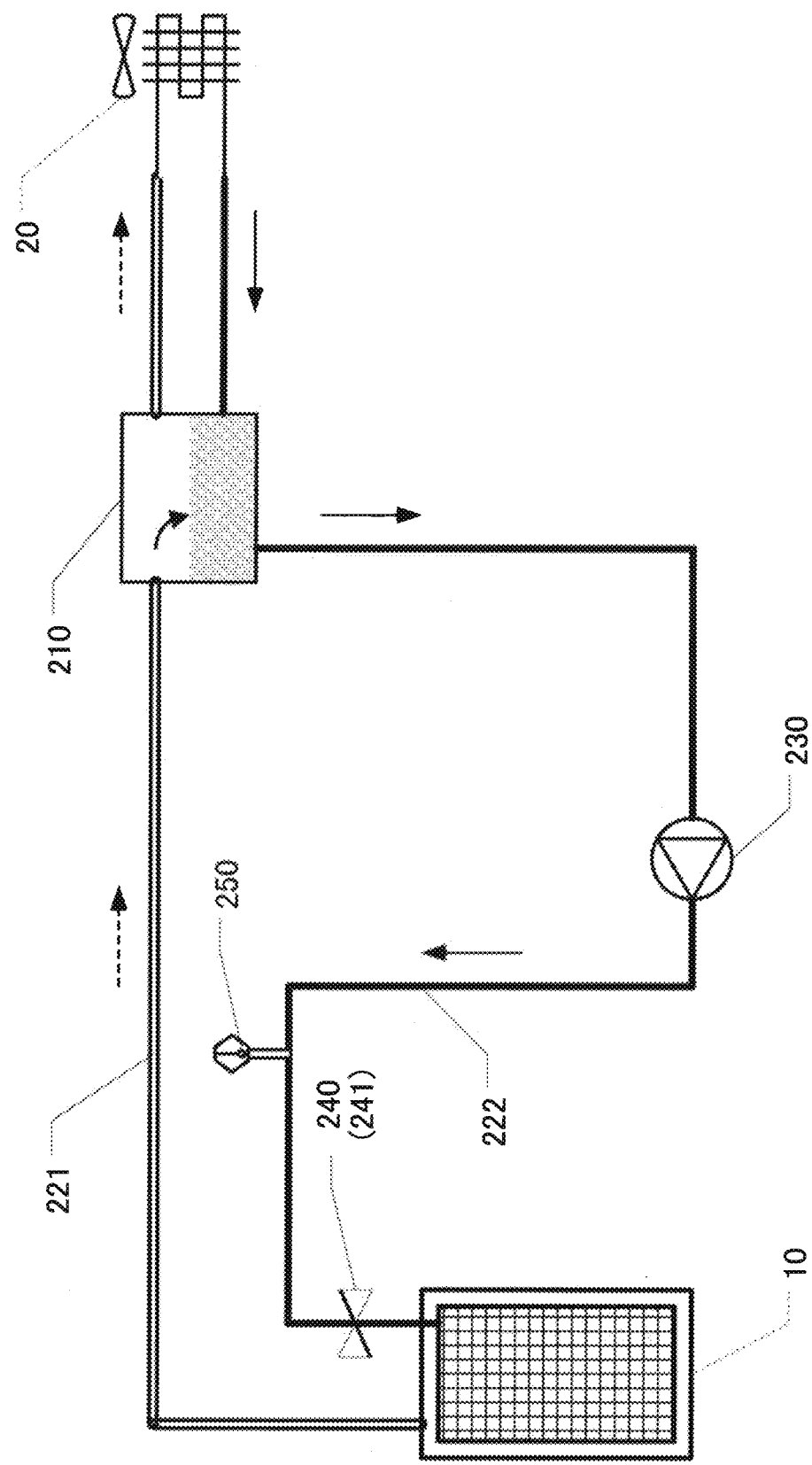
FIG. 2 is a schematic diagram illustrating a configuration of a refrigerant circulating apparatus according to a second example embodiment of the present invention.

Next, a second example embodiment of the present invention will be described. FIG. 2 schematically illustrates a configuration of a refrigerant circulating apparatus 201 according to the present example embodiment.

The refrigerant circulating apparatus 201 according to the present example embodiment includes a tank 210 serving as a refrigerant-liquid thermal equilibrium means, a vapor-phase pipe 221 having pipe sections 221A and 221B and a liquid-phase pipe 222 having pipe sections 222A and 222B serving as a refrigerant passage, a pump 230 serving as a refrigerant-liquid reflux means, and a valve 240 serving as a refrigerant-liquid flow control means.

Figure 3:
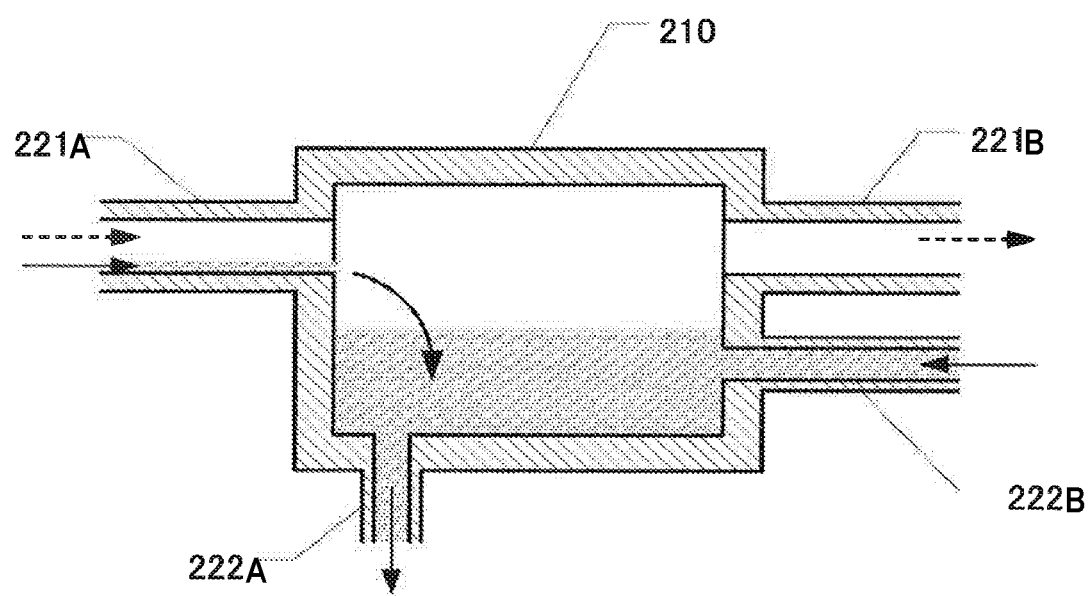
FIG. 3 is a cross-sectional view illustrating a configuration of a tank included in the refrigerant circulating apparatus according to the second example embodiment of the present invention.

FIG. 3 illustrates a configuration of the tank 210 serving as the refrigerant-liquid thermal equilibrium means. As illustrated in FIG. 3, the pipe sections 221A and 221B of the vapor-phase pipe and the pipe sections 222A and 222B of the liquid-phase pipe, which are connected to a heat receiving unit (heat receiving means) 10 and a heat radiating unit (heat radiating means) 20 respectively, are connected to the tank 210.

The refrigerant circulating apparatus 201 of the present example embodiment further includes a thermometer 250 serving as a refrigerant-liquid temperature measuring means for measuring a temperature of a reflux refrigerant liquid flowing back to the heat receiving unit (heat receiving means) 10 and outputting a refrigerant liquid temperature, and a control means (not illustrated). The control means controls the valve (refrigerant-liquid flow control means) 240 based on the refrigerant liquid temperature.

Here, in the refrigerant circulating apparatus 201 of the present example embodiment, the valve (refrigerant-liquid flow control means) 240 is a first valve 241 serving as a first refrigerant-liquid flow control means for controlling a flow rate of a reflux refrigerant liquid flowing into the heat receiving unit (heat receiving means) 10. In other words, the first valve 241 is configured to be disposed in the liquid-phase pipe 222 near to the heat receiving unit 10.

When the refrigerant liquid temperature is lower than or equal to a predetermined temperature, the control means controls the first valve (first refrigerant-liquid flow control means) 241 so as to increase the flow rate of the reflux refrigerant liquid flowing into the heat receiving unit (heat receiving means) 10. Here, the above-mentioned predetermined temperature is typically a dew-point temperature in the environment where the heat receiving unit (heat receiving means) 10 is located.

The refrigerant circulating apparatus 201 of the present example embodiment can allow, with the pump 230, reflux of a refrigerant liquid whose volume is greater than or equal to a flow rate corresponding to the amount of latent heat into the heat receiving unit 10 by controlling the first valve 241 in the liquid-phase pipe 222 connected to the heat receiving unit 10. This causes an excess refrigerant liquid of a surplus refrigerant liquid having passed through the heat receiving unit 10 and having increased in temperature by sensible heat to be also sent to the vapor-phase pipe 221. Then the excess refrigerant liquid is mixed, in the tank 210, with a supercooled refrigerant liquid flowing back from the heat radiating unit (heat radiating means) 20 disposed in an outdoor unit and reaches a state of thermal equilibrium. This enables the temperature of the refrigerant liquid flowing back to the heat receiving unit 10 disposed inside a room to increase higher than the dew-point temperature.

Therefore, according to the refrigerant circulating apparatus 201 of the present example embodiment, dew condensation in an indoor unit can be prevented without decreasing the cooling performance of a phase-change cooling apparatus including the indoor unit and an outdoor unit.

Figure 4:
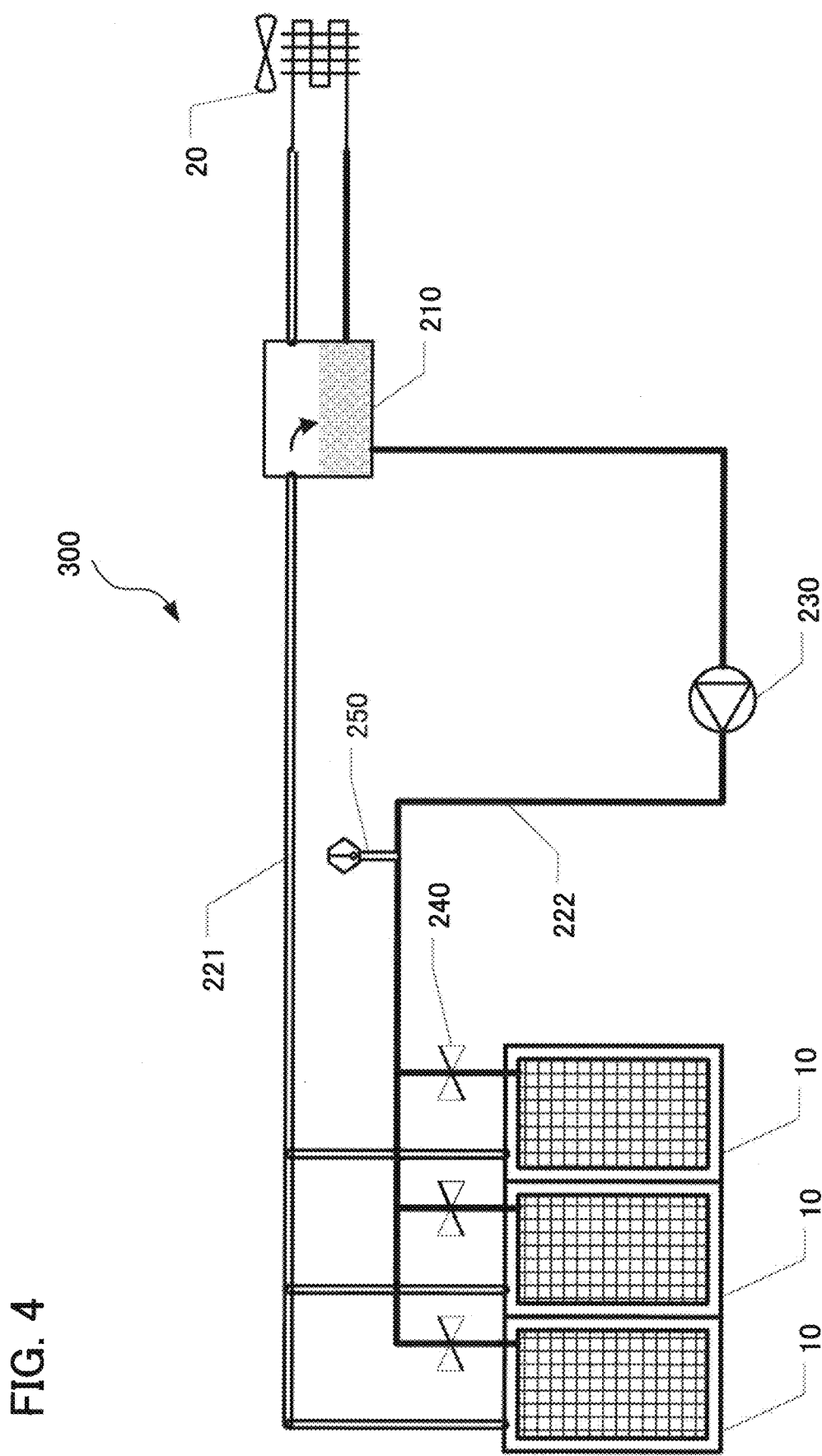
FIG. 4 is a schematic diagram illustrating a configuration of a phase-change cooling apparatus including the refrigerant circulating apparatus according to the second example embodiment of the present invention.

As illustrated in FIG. 4, a phase-change cooling apparatus 300 is configured with the refrigerant circulating apparatus 201 of the present example embodiment, the heat receiving unit (heat receiving means) 10, and the heat radiating unit (heat radiating means) 20. The heat receiving unit (heat receiving means) 10 includes an evaporator configured to contain a refrigerant and generate a gas-liquid two-phase refrigerant by receiving heat. The heat radiating unit (heat radiating means) 20 includes a condenser configured to condense and liquefy the gas-liquid two-phase refrigerant and generate a supercooled refrigerant liquid that is supercooled to the outside air temperature. As illustrated in FIG. 4, the phase-change cooling apparatus 300 can be configured to include a plurality of heat receiving units 10.

Next, the operation of the refrigerant circulating apparatus 201 according to the present example embodiment will be described in more detail.

As illustrated in FIG. 2, the refrigerant liquid (solid line arrow in the diagram) sent by the pump 230 is vaporized by receiving heat in the heat receiving unit 10, and then turns into a vapor phase refrigerant (broken line arrow in the diagram) and flows through the vapor-phase pipe 221. The vapor phase refrigerant is transported to the heat radiating unit 20 disposed in the outdoor unit through the vapor-phase pipe 221, condenses and liquefies by radiating heat in the heat radiating unit 20, and turns to a liquid-phase refrigerant. The liquid-phase refrigerant then returns to the pump 230 through the liquid-phase pipe 222.

In the phase-change cooling method, a cooling apparatus can be put into the operation state where only a vapor phase refrigerant flows through the vapor-phase pipe 221 by controlling an amount of refrigerant sent to the heat receiving unit 10 by the valve 240. At this time, the amount of refrigerant sent to the heat receiving unit 10 becomes equal to the amount of refrigerant liquid required to draw heat by phase change, that is, a flow rate required to draw heat by only latent heat of the refrigerant.

In contrast, in the refrigerant circulating apparatus 201 of the present example embodiment, if the temperature of the refrigerant liquid monitored with the thermometer 250 is lower than or equal to a dew-point temperature, a flow rate of the refrigerant liquid is made to be higher than a flow rate required to draw heat by latent heat only. The valve 240 is controlled so that the temperature of the refrigerant liquid may be raised above the dew-point temperature.

The refrigerant liquid without having phase-changed to a vapor phase in the heat receiving unit 10 (excess refrigerant liquid) flows in the vapor-phase pipe 221 with the temperature having increased by sensible heat. This refrigerant liquid (excess refrigerant liquid) does not flow into the heat radiating unit 20 disposed in the outdoor unit and flows into the tank 210 disposed on the way.

As illustrated in FIG. 3, a liquid-phase refrigerant supercooled in the heat radiating unit 20 (supercooled refrigerant liquid) flows into the tank 210 through the liquid-phase pipe 222 connected to the heat radiating unit 20. The supercooled refrigerant liquid is mixed with the refrigerant liquid having flowed in the vapor-phase pipe 221 with the temperature having increased (excess refrigerant liquid), and flows back to the pump 230 with the temperature becoming higher than a dew-point temperature.

As described above, because the refrigerant liquid having flowed through the vapor phase tube 221 (excess refrigerant liquid) is drained when passing through the tank 210, only a vapor phase refrigerant with high-temperature state flows through the vapor-phase pipe 221 toward the heat radiating unit 20. The vapor phase refrigerant is not heat-exchanged; therefore, it does not condense in the course of the vapor-phase pipe 221. This prevents the heat transport performance from decreasing due to a refrigerant liquid having condensed and liquefied in the vapor-phase pipe 221.

The first valve 241 controls a flow rate of a reflux refrigerant liquid flowing into the heat receiving unit 10 so that it may become a following flow rate. A refrigerant at a flow rate Q1 required to draw heat by latent heat reaches to an outside air temperature in the heat radiating unit 20 disposed outside. Accordingly, the first valve 241 controls the flow rate of the reflux refrigerant liquid so that it may become a flow rate at which a refrigerant liquid (supercooled refrigerant liquid) at the flow rate Q1 having reached to the outside air temperature turns to a refrigerant liquid (reflux refrigerant liquid) with the temperature higher than a dew-point temperature by mixing with a refrigerant liquid (excess refrigerant liquid) at a flow rate Q2 with the temperature having increased by sensible heat in the heat receiving unit 10.

The flow rate of the refrigerant required to transport heat by latent heat is normally extremely low in comparison with the flow rate of the refrigerant required to transport heat by sensible heat. Consequently, the flow rate of the refrigerant liquid flowing through the vapor-phase pipe 221 is low. However, it is preferable in order to suppress an increase in the pressure loss of the vapor-phase pipe 221 that the inner diameter of the vapor-phase pipe 221 should be a diameter obtained by considering a rise in pressure loss due to a refrigerant liquid flowing in the pipe.

Figure 5:
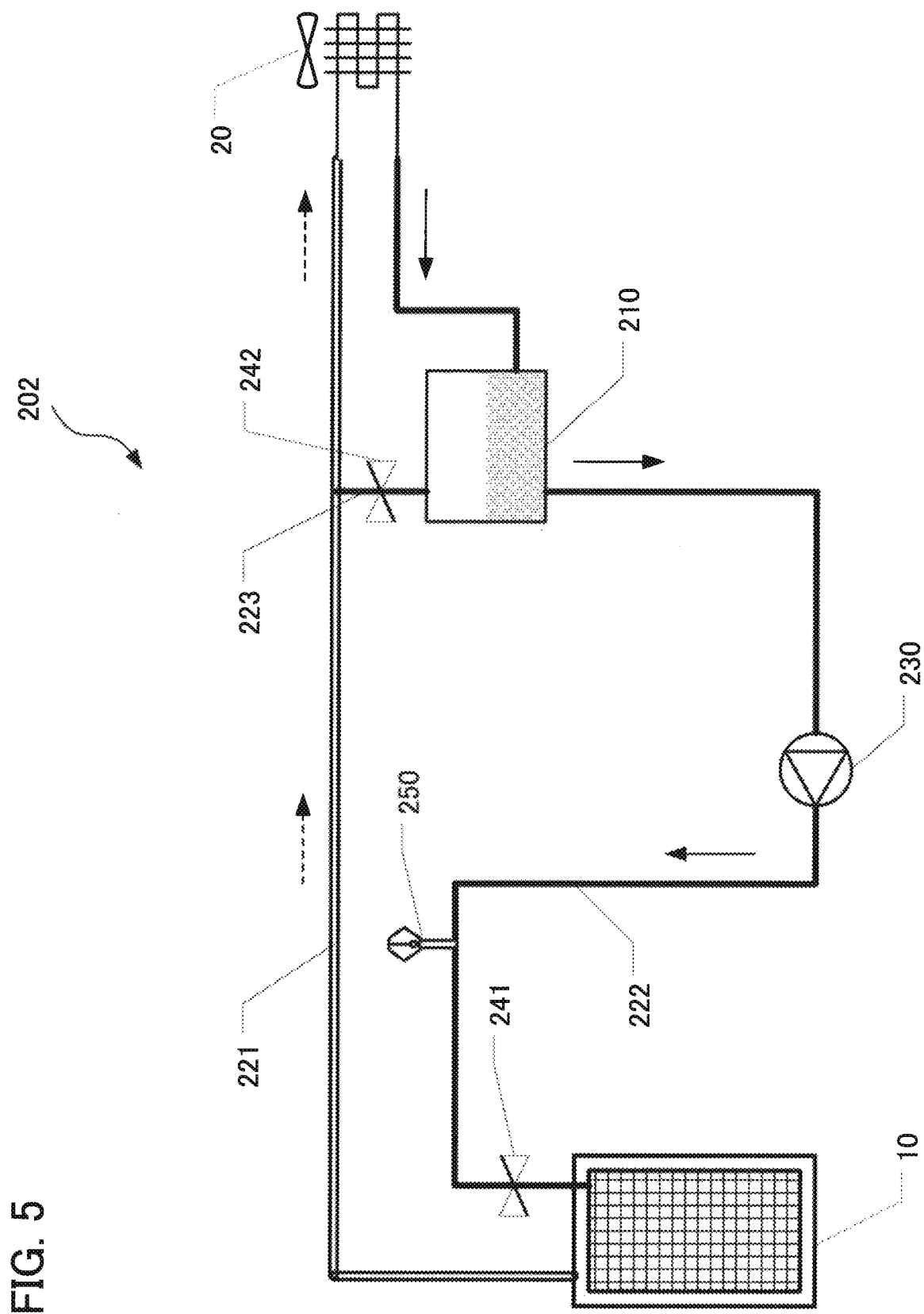
FIG. 5 is a schematic diagram illustrating another configuration of the refrigerant circulating apparatus according to the second example embodiment of the present invention.

FIG. 5 schematically illustrates another configuration of the refrigerant circulating apparatus according to the present example embodiment.

Figure 6:
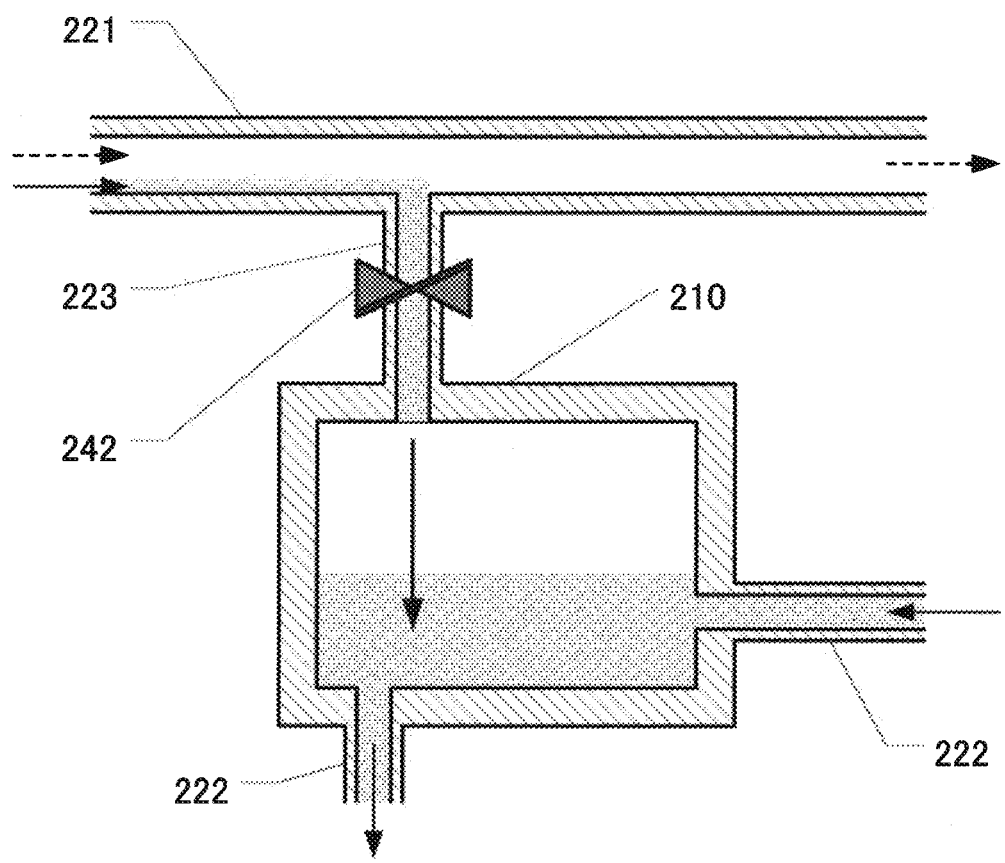
FIG. 6 is a cross-sectional view illustrating another configuration near the tank included in the refrigerant circulating apparatus according to the second example embodiment of the present invention.

A refrigerant circulating apparatus 202 illustrated in FIG. 5 is configured to include a second valve 242 serving as a second refrigerant-liquid flow control means for controlling a flow rate of an excess refrigerant liquid flowing into the tank (refrigerant-liquid thermal equilibrium means) 210. FIG. 6 illustrates an arrangement and a configuration of the tank 210 and the second valve 242. As illustrated in FIG. 6, the refrigerant circulating apparatus 202 is configured to include a bypass pipe 223 between the vapor-phase pipe 221 and the tank 210, and the second valve 242 disposed in the bypass pipe 223.

When the refrigerant liquid temperature measured with the thermometer 250 is lower than or equal to a predetermined temperature, the control means (not illustrated) controls the second valve (second refrigerant-liquid flow control means) 242 so as to increase the flow rate of the excess refrigerant liquid flowing into the tank (refrigerant-liquid thermal equilibrium means) 210.

At this time, the excess refrigerant liquid flows in the bypass pipe 223 through the second valve 242 (hatched area in FIG. 6) and drips into the tank 210 (downward arrow in FIG. 6).

In contrast, when the refrigerant liquid temperature is higher than the predetermined temperature, the second valve (second refrigerant-liquid flow control means) 242 is controlled so as to reduce the flow rate of the excess refrigerant liquid flowing into the tank (refrigerant-liquid thermal equilibrium means) 210. Here, the above-mentioned predetermined temperature is typically a dew-point temperature in the environment where the heat receiving unit (heat receiving means) 10 is located.

As described above, the second valve 242 can be closed under the environment of the outside air where the refrigerant liquid temperature is higher than the dew-point temperature. This enables a pressure loss in piping due to the tank 210 located in the vapor-phase pipe 221 to be reduced. Therefore, it becomes possible to prevent reliably the heat transport performance from decreasing in summertime when the outside air temperature is high.

Figure 7:
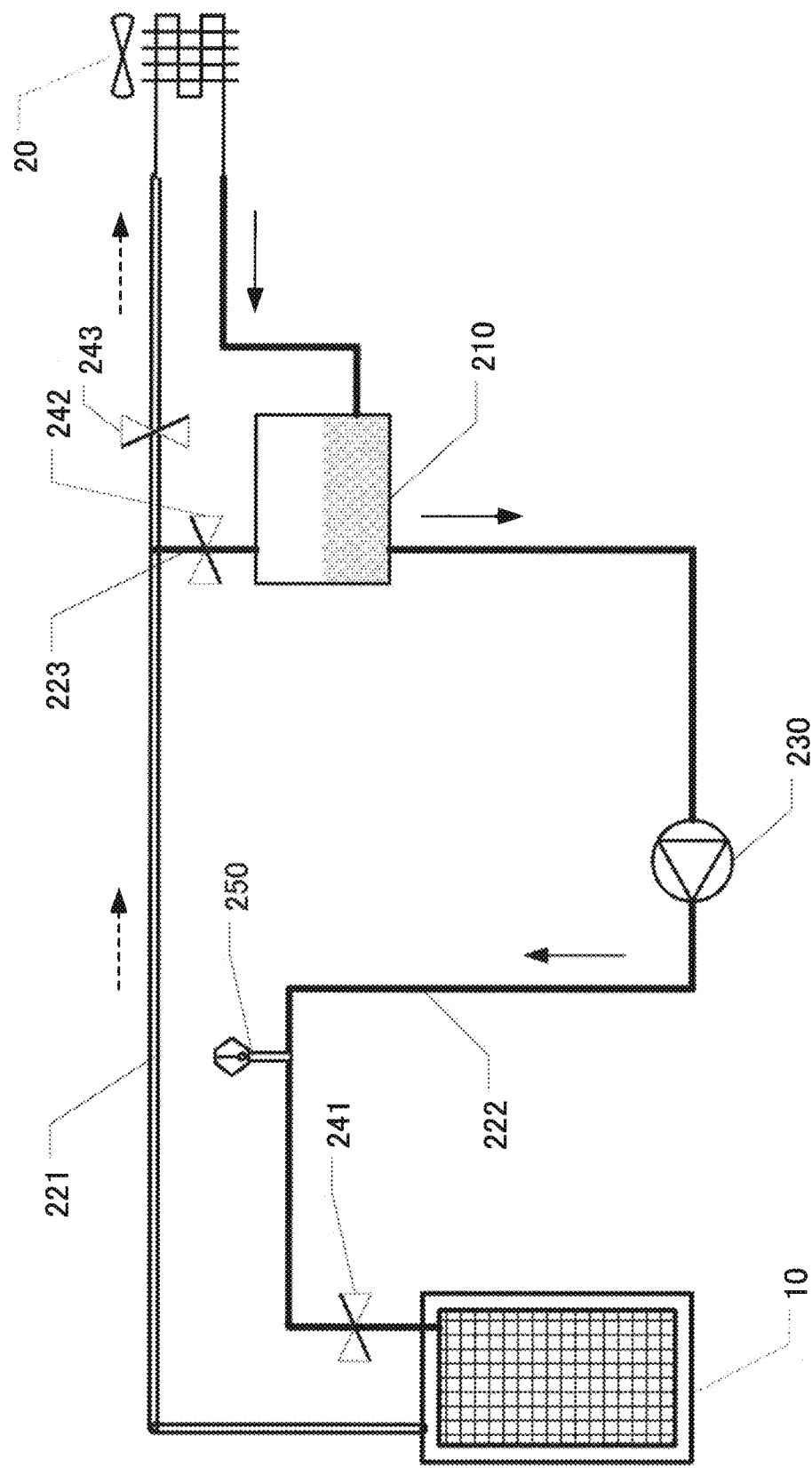
FIG. 7 is a schematic diagram illustrating yet another configuration of the refrigerant circulating apparatus according to the second example embodiment of the present invention.

FIG. 7 schematically illustrates a yet another configuration of the refrigerant circulating apparatus according to the present example embodiment.

Figure 8:
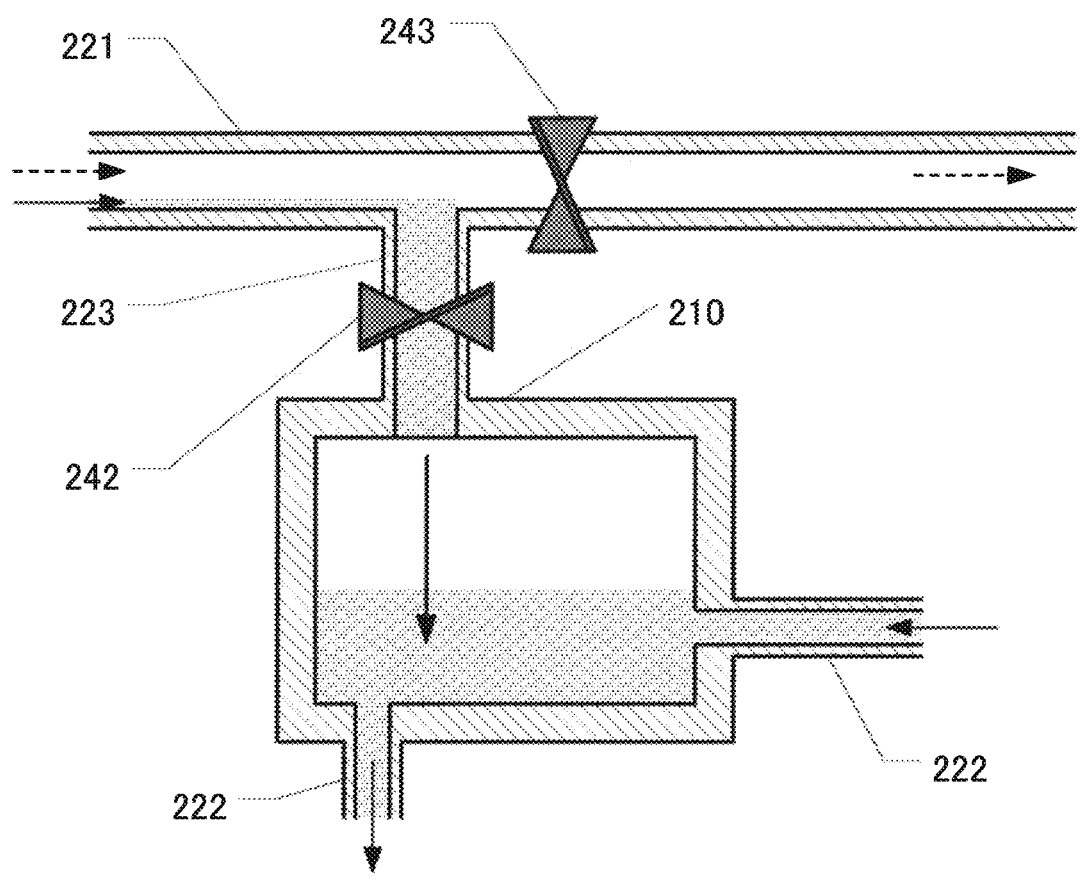
FIG. 8 is a cross-sectional view illustrating yet another configuration near the tank included in the refrigerant circulating apparatus according to the second example embodiment of the present invention.

A refrigerant circulating apparatus 203 illustrated in FIG. 7 is configured to include a third valve 243 serving as a third refrigerant-liquid flow control means for controlling the flow rate of the excess refrigerant liquid having passed through the tank (refrigerant-liquid thermal equilibrium means) 210 and flowing out to the heat radiating unit (heat radiating means) 20. FIG. 8 illustrates an arrangement and a configuration of the tank 210 and the third valve 243. As illustrated in FIG. 8, the refrigerant circulating apparatus 203 is configured to include the third valve 243 located closer to the heat radiating unit 20 than the bypass pipe 223 of the vapor-phase pipe 221.

When the refrigerant liquid temperature is lower than or equal to a predetermined temperature, a control means (not illustrated) controls the third valve (third refrigerant-liquid flow control means) 243 so as to reduce the flow rate of the excess refrigerant liquid flowing out to the heat radiating unit 20. Here, the above-mentioned predetermined temperature is typically a dew-point temperature in the environment where the heat receiving unit (heat receiving means) 10 is located.

As described above, the refrigerant circulating apparatus 203 is configured to further include the third valve 243; consequently, the excess refrigerant liquid flowing in from the heat receiving unit 10 can be prevented from flowing out to the heat radiating unit 20 side and can be flowed back to the heat receiving unit 10 more reliably. This makes it possible to prevent more reliably the cooling performance of the refrigerant circulating apparatus 203 from decreasing.

In this case, the excess refrigerant liquid also flows in the bypass pipe 223 through the second valve 242 (hatched area in FIG. 8) and drips into the tank 210 (downward arrow in FIG. 8).

Next, a method of circulating a refrigerant according to the present example embodiment will be described.

In the method of circulating a refrigerant in the present example embodiment, first, an excess refrigerant liquid and a supercooled refrigerant liquid are made to be in thermal equilibrium with each other. The excess refrigerant liquid is a liquid-phase refrigerant included in a gas-liquid two-phase refrigerant arising on a heat receiving side. The supercooled refrigerant liquid arises due to the gas-liquid two-phase refrigerant cooled on a heat radiating side. Then, a reflux refrigerant liquid composed of the excess refrigerant liquid and the supercooled refrigerant liquid that are in thermal equilibrium is generated, and the reflux refrigerant liquid is refluxed to the heat receiving side.

In the method of circulating a refrigerant in the present example embodiment, a temperature of the reflux refrigerant liquid flowing back to the heat receiving side is further measured, and a refrigerant liquid temperature is obtained. Then the flow rate of the reflux refrigerant liquid is controlled based on the refrigerant liquid temperature.

When the refrigerant liquid temperature is lower than or equal to a predetermined temperature, the flow rate of the reflux refrigerant liquid flowing out to the heat receiving side can be increased.

When the refrigerant liquid temperature is lower than or equal to the predetermined temperature, the flow rate of the excess refrigerant liquid constituting the reflux refrigerant liquid may be increased. When the refrigerant liquid temperature is higher than the predetermined temperature, the flow rate of the excess refrigerant liquid constituting the reflux refrigerant liquid may be reduced.

In addition, when the refrigerant liquid temperature is lower than or equal to the predetermined temperature, the flow rate of the excess refrigerant liquid flowing out to the heat radiating side may be reduced.

The above-mentioned predetermined temperature is typically a dew-point temperature in the environment on the heat receiving side.

As described above, according to the refrigerant circulating apparatuses 201, 202, and 203 and the method of circulating a refrigerant in the present example embodiment, dew condensation in an indoor unit can be prevented without decreasing the cooling performance of a phase-change cooling apparatus including the indoor unit and an outdoor unit.

Third Example Embodiment

Next, a third example embodiment of the present invention will be described. The configuration of a refrigerant circulating apparatus according to the present example embodiment is the same as the configuration of the refrigerant circulating apparatus 202 according to the second example embodiment illustrated in FIG. 5. That is to say, the refrigerant circulating apparatus in the present example embodiment is configured to include the second valve 242 serving as the second refrigerant-liquid flow control means for controlling the flow rate of an excess refrigerant liquid flowing into the tank (refrigerant-liquid thermal equilibrium means) 210.

Figure 9:
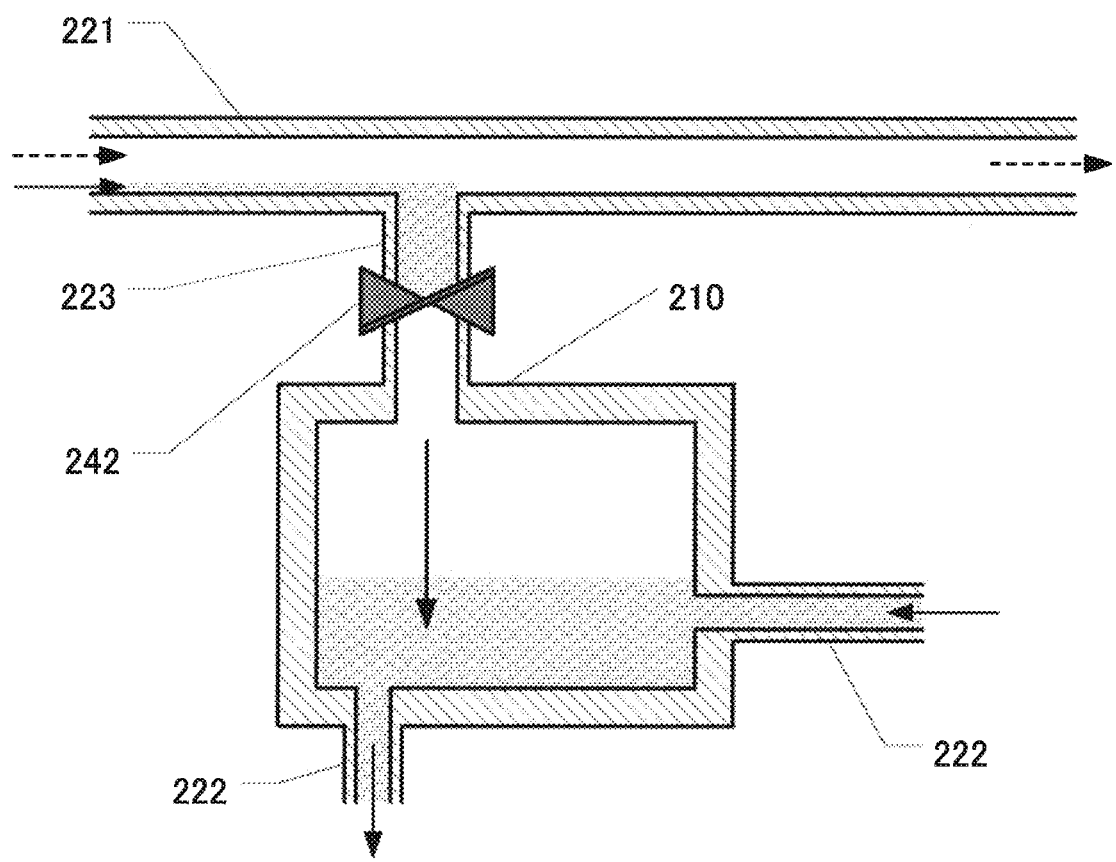
FIG. 9 is a cross-sectional view illustrating a configuration near a tank included in a refrigerant circulating apparatus according to a third example embodiment of the present invention.

FIG. 9 illustrates an arrangement and a configuration of the tank 210 and the second valve 242. As illustrated in FIG. 9, the refrigerant circulating apparatus in the present example embodiment is configured to include the bypass pipe 223 between the vapor-phase pipe 221 and the tank 210, and the second valve 242 disposed in the bypass pipe 223.

The refrigerant circulating apparatus in the present example embodiment differs from the refrigerant circulating apparatus 202 according to the second example embodiment in the operation of a control means (not illustrated). When the refrigerant liquid temperature measured with the thermometer 250 is higher than a predetermined temperature, the control means controls the second valve 242 so as to reduce the flow rate of the excess refrigerant liquid flowing into the tank 210. Here, the above-mentioned predetermined temperature is typically a dew-point temperature in the environment where the heat receiving unit (heat receiving means) 10 is located. The control means in the present example embodiment controls a degree of opening of the second valve 242 so that a liquid level of the excess refrigerant liquid (first refrigerant liquid) may be formed on an inflow side of the second valve 242.

That is to say, if the second valve 242 is completely closed when the refrigerant liquid temperature is higher than the predetermined temperature, the excess refrigerant liquid remains within the vapor-phase pipe 221, and the pressure loss of the vapor phase refrigerant flowing through the vapor-phase pipe 221 increases, which causes heat transport performance to deteriorate. However, in the refrigerant circulating apparatus according to the present example embodiment, a degree of opening of the second valve 242 is controlled so that the liquid level of the excess refrigerant liquid may be formed on the second valve 242 in the bypass pipe 223. Specifically, for example, the second valve 242 is completely closed temporarily, and the excess refrigerant liquid is filled in the upstream side of the bypass pipe 223 above the second valve 242 (hatched area in FIG. 9). Then the opening of the second valve 242 is expanded, which causes a part of the filled excess refrigerant liquid to drip (downward arrow in FIG. 9). Subsequently, the second valve 242 is completely closed again, and the excess refrigerant liquid is filled in the bypass pipe 223. This makes it possible to prevent the excess refrigerant liquid from passing through a connection portion with the bypass pipe 223 and flowing to the downstream side in the vapor-phase pipe 221 (heat radiating unit 20); therefore, it is possible to avoid the deterioration of heat transport performance due to an increase in the pressure loss.

The vapor phase refrigerant included in the gas-liquid two-phase refrigerant flowing through the vapor-phase pipe 221 flows due to a pressure gradient between the heat receiving unit (heat receiving means) 10 and the heat radiating unit (heat radiating means) 20. As a result, when the pressure gradient decreases due to a pressure loss of a piping system connecting the heat receiving unit 10 to the heat radiating unit 20, the vapor phase refrigerant may also flow into the tank 210 through the bypass pipe 223 together with the excess refrigerant liquid.

However, in the refrigerant circulating apparatus in the present example embodiment, as illustrated in FIG. 9, the control means controls a degree of opening of the second valve 242 so that the liquid level of the excess refrigerant liquid may be formed on the inflow side of the second valve 242. This prevents the vapor phase refrigerant flowing through the vapor-phase pipe 221 from flowing into the tank 210 due to the liquid level of the excess refrigerant. This enables the vapor phase refrigerant to flow toward the heat radiating unit 20 without flowing into the tank 210 even though the outside air temperature increases, and the pressure gradient between the heat receiving unit 10 and the heat radiating unit 20 decreases. As a result, a decrease in heat transport performance can be suppressed.

According to the refrigerant circulating apparatus in the present example embodiment, as with the refrigerant circulating apparatus 202 according to the second example embodiment, dew condensation in an indoor unit can be prevented without decreasing the cooling performance of a phase-change cooling apparatus including the indoor unit and an outdoor unit.

Fourth Example Embodiment

Figure 10:
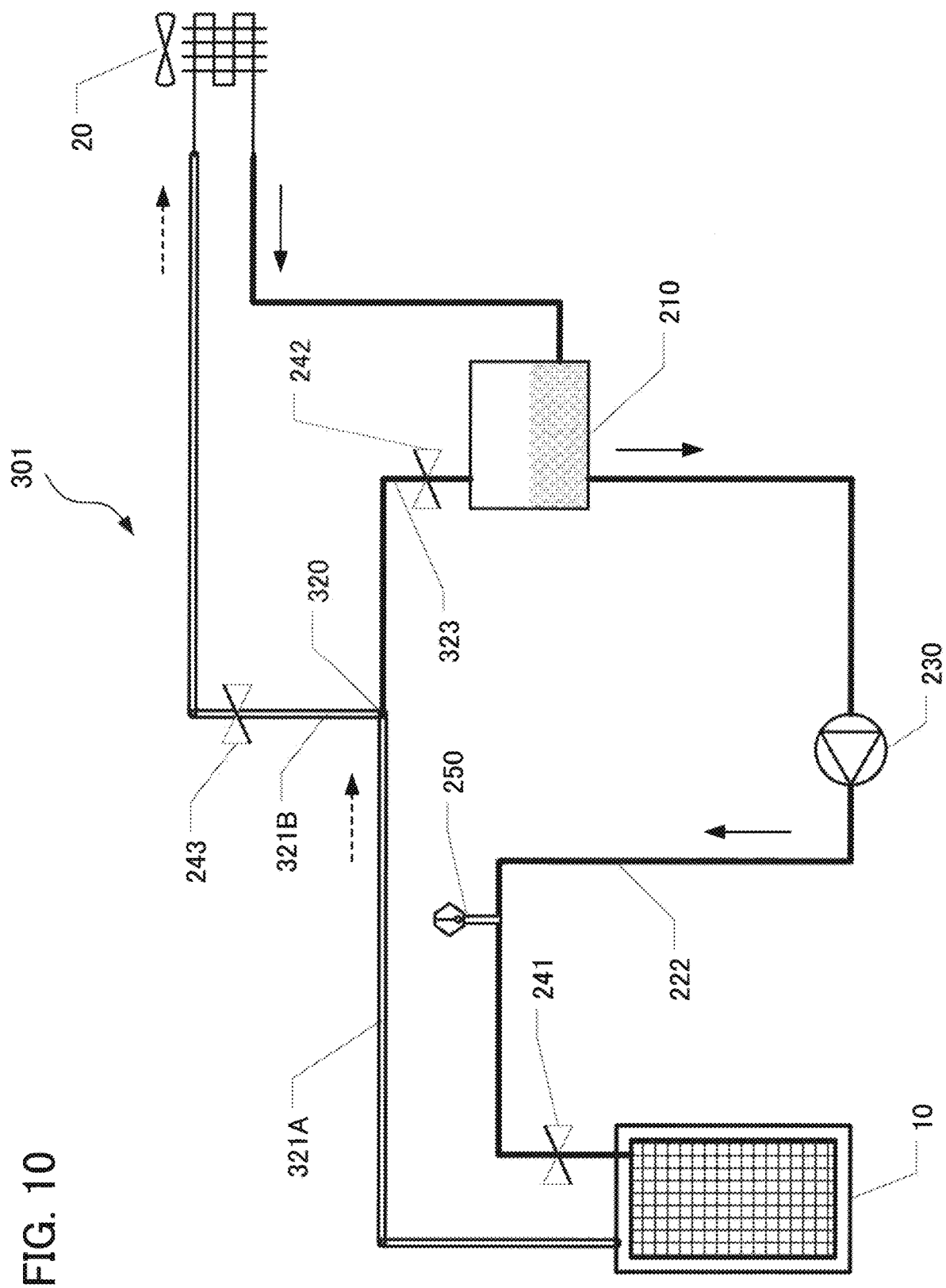
FIG. 10 is a schematic diagram illustrating a configuration of a phase-change cooling apparatus according to a fourth example embodiment of the present invention.

Next, a fourth example embodiment of the present invention will be described. FIG. 10 schematically illustrates a configuration of a phase-change cooling apparatus 301 according to the present example embodiment.

The phase-change cooling apparatus 301 according to the present example embodiment includes a heat receiving unit (heat receiving means) 10, a heat radiating unit (heat radiating means) 20, and a refrigerant circulating apparatus. The refrigerant circulating apparatus 202 or the refrigerant circulating apparatus 203 according to the second example embodiment can be used as the refrigerant circulating apparatus. That is to say, the refrigerant circulating apparatus includes the tank 210 serving as the refrigerant-liquid thermal equilibrium means, the pump 230 serving as the refrigerant-liquid reflux means, and a valve serving as a refrigerant-liquid flow control means. FIG. 10 illustrates a configuration in which the second valve 242 and the third valve 243 serving as the refrigerant-liquid flow control means are included.

Figure 11:
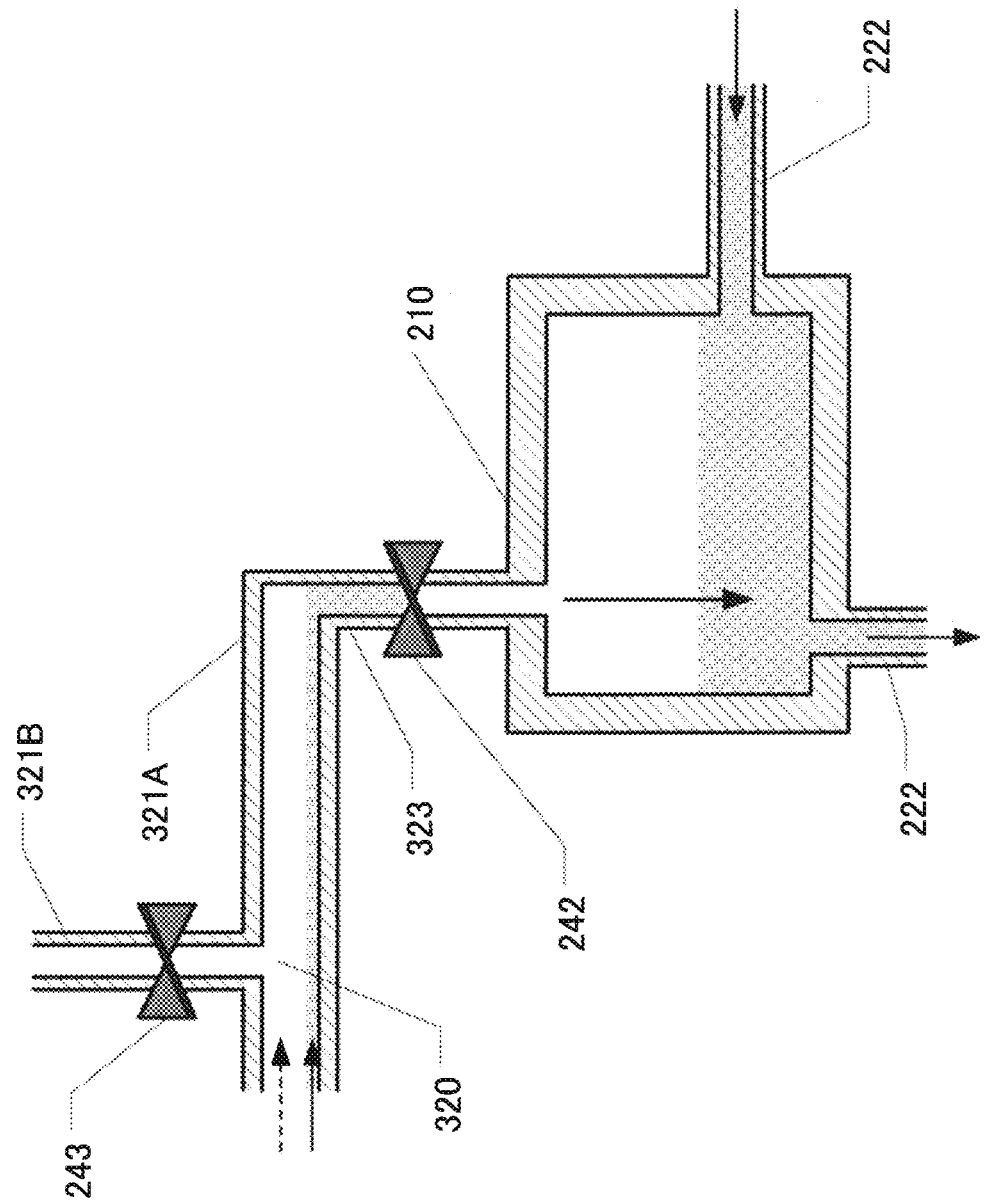
FIG. 11 is a cross-sectional view illustrating a configuration near a tank included in the phase-change cooling apparatus according to the fourth example embodiment of the present invention.

The phase-change cooling apparatus 301 according to the present example embodiment further includes a first vapor-phase pipe 321A having an end connected to the heat receiving unit 10, a second vapor-phase pipe 321B connecting the heat radiating unit 20 to a branch portion 320 of a predetermined place of the first vapor-phase pipe 321A, and a bypass pipe 323. The bypass pipe 323 connects the other end of the first vapor-phase pipe 321A to the tank 210. FIG. 11 illustrates a configuration near to the tank 210.

As illustrated in FIG. 10, the second vapor-phase pipe 321B constitutes a passage through which the vapor phase refrigerant included in the gas-liquid two-phase refrigerant flows upward from the first vapor-phase pipe 321A toward the heat radiating unit 20.

Because the excess refrigerant liquid included in the gas-liquid two-phase refrigerant has a larger density than that of the vapor phase refrigerant, it flows on the lower side of the section of the first vapor-phase pipe 321A. As mentioned above, the second vapor-phase pipe 321B constitutes a passage through which the vapor phase refrigerant flows upward toward the heat radiating unit 20. In other words, the second vapor-phase pipe 321B has a rising slope. This prevents the excess refrigerant liquid having a large density from rising in the second vapor-phase pipe 321B; consequently, the excess refrigerant liquid flows into the bypass pipe 323 directly.

Because the excess refrigerant liquid also has great inertial force due to large density, a part of the excess refrigerant liquid passes without flowing into the bypass pipe 323 and remains within the first vapor-phase pipe 321A if the bypass pipe 323 is connected on the way of the first vapor-phase pipe 321A. However, in the phase-change cooling apparatus 301 according to the present example embodiment, all the excess refrigerant liquid flows into the bypass pipe 323 and is introduced into the tank 210 because the bypass pipe 323 is connected to the other end of the first vapor-phase pipe 321A.

The above-described configuration makes it possible to avoid occurrence of a pressure loss due to a collision between the rising vapor phase refrigerant and the excess refrigerant liquid dripping downward without rising along the rising slope of the second vapor-phase pipe 321B. As a result, a decrease in heat transport performance can be suppressed.

Figure 12:
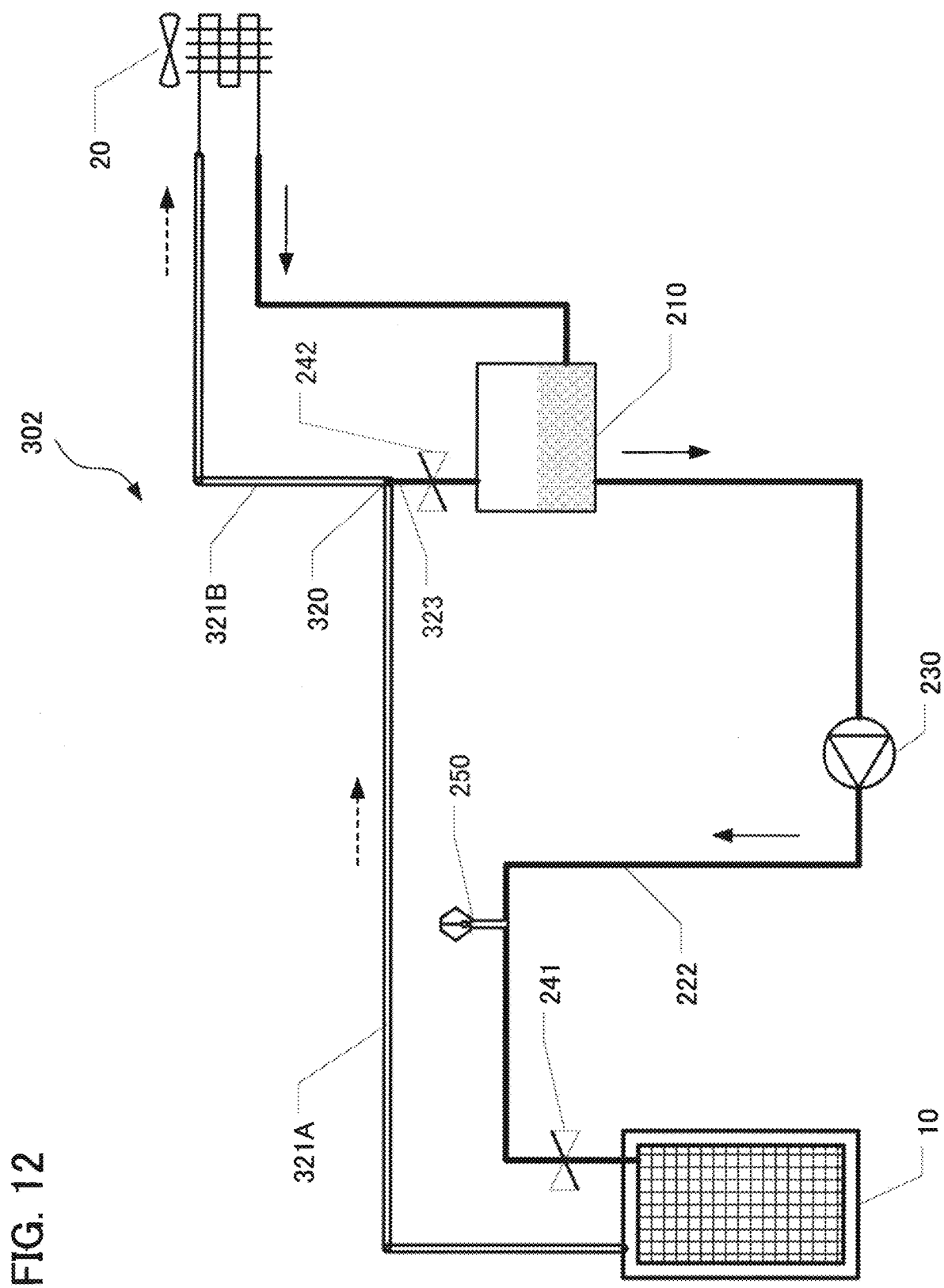
FIG. 12 is a schematic diagram illustrating another configuration of the phase-change cooling apparatus according to the fourth example embodiment of the present invention.
Figure 13:
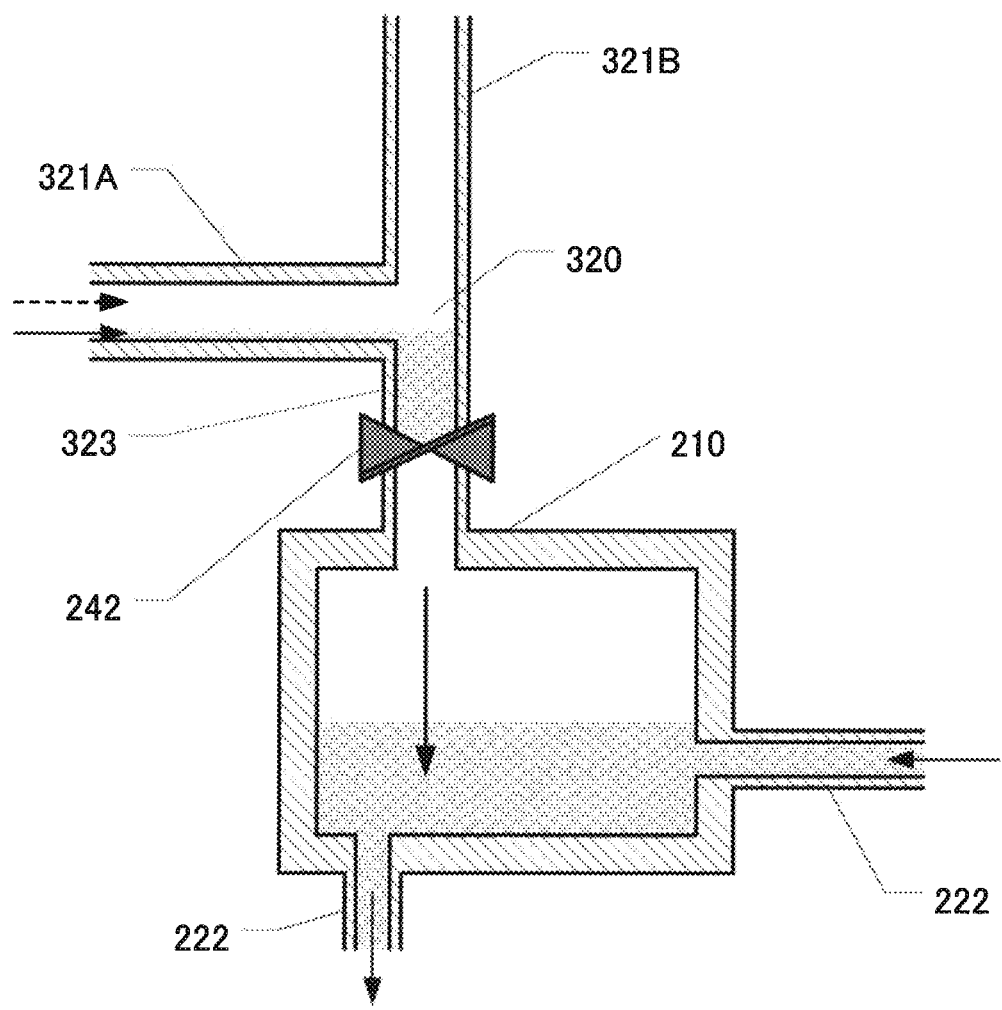
FIG. 13 is a cross-sectional view illustrating another configuration near the tank included in the phase-change cooling apparatus according to the fourth example embodiment of the present invention.
Figure 14:
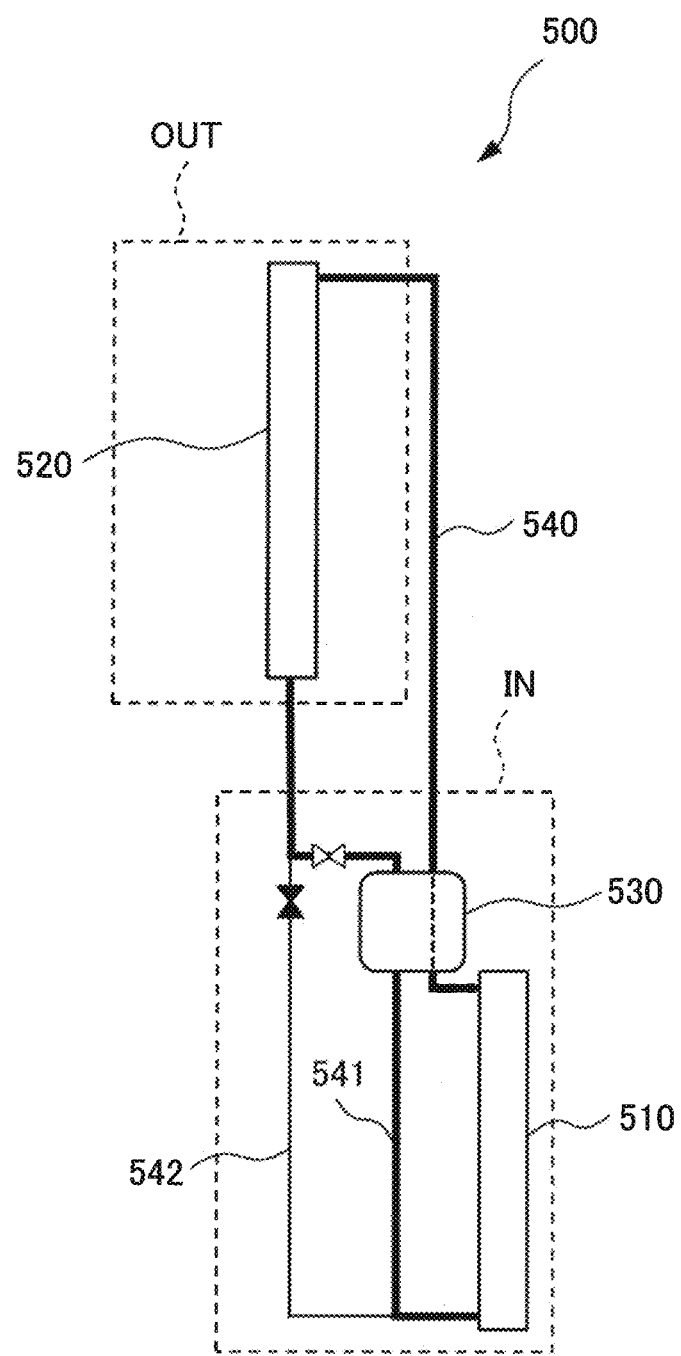
FIG. 14 is a schematic diagram illustrating a schematic configuration of a related cooling system.

FIG. 10 illustrates the configuration in which the branch portion 320 is located on the way of the first vapor-phase pipe 321A; however, it is not limited to this, as a phase-change cooling apparatus 302 illustrated in FIG. 12, the branch portion 320 may be located at the other end of the first vapor-phase pipe 321A. That is to say, the other end of the first vapor-phase pipe 321A can be connected to the second vapor-phase pipe 321B and the bypass pipe 323. FIG. 13 illustrates the configuration near to the tank 210.

In this case, after the gas-liquid two-phase refrigerant having flowed through the first vapor-phase pipe 321A collides at the connection portion of the branch portion 320, the excess refrigerant liquid drips into the bypass pipe 323 by the action of gravity, and the vapor phase refrigerant can rise along the pressure gradient in the second vapor-phase pipe 321B.

The above-described configuration makes it possible to avoid occurrence of a pressure loss due to the excess refrigerant liquid remaining in the vapor-phase pipe. As a result, a decrease in heat transport performance can be suppressed.

Each of the phase-change cooling apparatuses 301 and 302 of the present example embodiment includes the refrigerant circulating apparatus 202 or the refrigerant circulating apparatus 203 according to the second example embodiment. Therefore, dew condensation in an indoor unit can be prevented without decreasing the cooling performance of a phase-change cooling apparatus including the indoor unit and an outdoor unit.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2015-248300, filed on Dec. 21, 2015 and Japanese patent application No. 2016-100449, filed on May 19, 2016, the disclosure of which is incorporated herein in its entirety by reference.

REFERENCE SIGNS LIST 100, 201, 202, 203 Refrigerant circulating apparatus
110 Refrigerant-liquid thermal equilibrium means
120 Refrigerant passage
130 Refrigerant-liquid reflux means
140 Refrigerant-liquid flow control means
210 Tank
221 Vapor-phase pipe
222 Liquid-phase pipe
223, 323 Bypass pipe
230 Pump
240 Valve
241 First valve
242 Second valve
243 Third valve
250 Thermometer
300, 301, 302 Phase-change cooling apparatus
320 Branch portion
321A First vapor-phase pipe
321B Second vapor-phase pipe
500 Related cooling system
510 Indoor heat exchange unit
520 Outdoor heat exchange unit
530 Internal heat exchanger
540 Piping system
541 First supply pipe
542 Second supply pipe
10 Heat receiving means (heat receiving unit)
20 Heat radiating means (heat radiating unit)

What is claimed is:

1. A refrigerant circulating apparatus, comprising:
a tank with inlets and outlets for piping, the tank configured to mix a first refrigerant liquid with a second refrigerant liquid and send a reflux refrigerant liquid composed of the first refrigerant liquid and the second refrigerant liquid, the first refrigerant liquid being a liquid-phase refrigerant included in a gas-liquid two-phase refrigerant flowing in from a heat receiving section, the second refrigerant liquid arising due to the gas-liquid two-phase refrigerant cooled by a heat radiating section;
a refrigerant passage configured for the gas-liquid two-phase refrigerant and the reflux refrigerant liquid to circulate between the heat receiving section and the tank;
a pump configured to reflux the reflux refrigerant liquid to the heat receiving section through the refrigerant passage;
a variable flow rate valve configured to control a flow rate of the reflux refrigerant liquid;
a refrigerant-liquid temperature measuring section configured to measure a temperature of the reflux refrigerant liquid flowing back to the heat receiving section and output a refrigerant liquid temperature; and
a controller configured to control the variable flow rate valve based on the refrigerant liquid temperature,
wherein the variable flow rate valve is located in the refrigerant passage between the heat receiving section and the pump, and is configured to control the flow rate of the reflux refrigerant liquid flowing into the heat receiving section,
the heat radiating section is disposed in an outdoor unit,
the heat receiving section is disposed inside a room, and
the controller controls the variable flow rate valve so as to increase the flow rate of the reflux refrigerant liquid flowing into the heat receiving section when the refrigerant liquid temperature is lower than or equal to a dew-point temperature in an environment where the heat receiving section is located.

2. The refrigerant circulating apparatus according to claim 1, wherein
the tank is configured to store the first refrigerant liquid and the second refrigerant liquid.

3. The refrigerant circulating apparatus according to claim 1, wherein
the variable flow rate valve includes a second variable flow rate valve configured to control a flow rate of the first refrigerant liquid flowing into the tank, and
the controller
controls the second variable flow rate valve so as to increase the flow rate of the first refrigerant liquid flowing into the tank when the refrigerant liquid temperature is lower than or equal to a predetermined temperature, and
controls the second variable flow rate valve so as to reduce the flow rate of the first refrigerant liquid flowing into the tank when the refrigerant liquid temperature is higher than the predetermined temperature.

4. The refrigerant circulating apparatus according to claim 3, wherein the controller controls the second variable flow rate valve so that a liquid level of the first refrigerant liquid may be formed on an inflow side of the second variable flow rate valve.

5. The refrigerant circulating apparatus according to claim 3, wherein
the variable flow rate valve includes a third variable flow rate valve configured to control a flow rate of the first refrigerant liquid having passed through the tank and flowing out to the heat radiating section, and
the controller controls the third variable flow rate valve so as to reduce the flow rate of the first refrigerant liquid flowing out to the heat radiating section when the refrigerant liquid temperature is lower than or equal to a predetermined temperature.

6. A phase-change cooling apparatus, comprising:
a heat receiving section;
a heat radiating section; and
a refrigerant circulating apparatus,
wherein the refrigerant circulating apparatus includes:
  a tank with inlets and outlets for piping, the tank configured to mix a first refrigerant liquid with a second refrigerant liquid and send a reflux refrigerant liquid composed of the first refrigerant liquid and the second refrigerant liquid, the first refrigerant liquid being a liquid-phase refrigerant included in a gas-liquid two-phase refrigerant flowing in from the heat receiving section, the second refrigerant liquid arising due to the gas-liquid two-phase refrigerant cooled by the heat radiating section;
  a refrigerant passage configured for the gas-liquid two-phase refrigerant and the reflux refrigerant liquid to circulate between the heat receiving section and the tank;
  a pump configured to reflux the reflux refrigerant liquid to the heat receiving section through the refrigerant passage;
  a variable flow rate valve a configured to control a flow rate of the reflux refrigerant liquid;
  a refrigerant-liquid temperature measuring section configured to measure a temperature of the reflux refrigerant liquid flowing back to the heat receiving section and output a refrigerant liquid temperature; and
  a controller configured to control the variable flow rate valve based on the refrigerant liquid temperature,
wherein the variable flow rate valve is located in the refrigerant passage between the heat receiving section and the pump, and is configured to control the flow rate of the reflux refrigerant liquid flowing into the heat receiving section, and
the controller controls the variable flow rate valve so as to increase the flow rate of the reflux refrigerant liquid flowing into the heat receiving section when the refrigerant liquid temperature is lower than or equal to a dew-point temperature in an environment where the heat receiving section is located,
wherein the heat receiving section is disposed inside a room and is configured to contain a refrigerant and generate the gas-liquid two-phase refrigerant by receiving heat,
the heat radiating section is disposed in an outdoor unit and is configured to condense and liquefy the gas-liquid two-phase refrigerant and generate the second refrigerant liquid supercooled to an outside air temperature.

7. The phase-change cooling apparatus according to claim 6, further comprising
a first vapor-phase pipe with one end connected to the heat receiving section;
a second vapor-phase pipe connecting the heat radiating section to a branch portion of a predetermined place of the first vapor-phase pipe; and
a bypass pipe connecting another end of the first vapor-phase pipe to the refrigerant-liquid thermal equilibrium section, wherein
the second vapor-phase pipe constitutes a passage through which a vapor phase refrigerant included in the gas-liquid two-phase refrigerant flows upward from the first vapor-phase pipe toward the heat radiating section.

\* \* \* \* \*